(12) United States Patent
Chen et al.

(10) Patent No.: US 11,723,175 B2
(45) Date of Patent: Aug. 8, 2023

(54) ROTARY LIQUID DISTRIBUTOR FOR LIQUID-COOLED TANK AND LIQUID-COOLED TANK

(71) Applicant: SHENZHEN MICROBT ELECTRONICS TECHNOLOGY CO., LTD., Guangdong (CN)

(72) Inventors: Qian Chen, Guangdong (CN); Fangyu Liu, Guangdong (CN); Yuefeng Wu, Guangdong (CN); Yang Gao, Guangdong (CN); Hongyan Ning, Guangdong (CN)

(73) Assignee: SHENZHEN MICROBT ELECTRONICS TECHNOLOGY CO., LTD., Nanshan District Shenzhen (CN)

( * ) Notice: Subject to any disclaimer, the term of this patent is extended or adjusted under 35 U.S.C. 154(b) by 0 days.

(21) Appl. No.: 17/799,518

(22) PCT Filed: Dec. 15, 2021

(86) PCT No.: PCT/CN2021/138326
§ 371 (c)(1),
(2) Date: Aug. 12, 2022

(87) PCT Pub. No.: WO2022/151898
PCT Pub. Date: Jul. 21, 2022

(65) Prior Publication Data
US 2023/0164949 A1    May 25, 2023

(30) Foreign Application Priority Data

Jan. 18, 2021    (CN) .......................... 202110060886.9

(51) Int. Cl.
*H05K 7/20*    (2006.01)
*B05B 3/12*    (2006.01)
(Continued)

(52) U.S. Cl.
CPC .......... *H05K 7/20272* (2013.01); *B05B 3/12* (2013.01); *F28F 25/02* (2013.01); *F28F 25/06* (2013.01);
(Continued)

(58) Field of Classification Search
CPC .......... H05K 7/20272; H05K 7/20236; H05K 7/203; B05B 3/12; F28F 25/02; F28F 25/06; F25B 2313/004; F28D 5/00; H01L 23/44
(Continued)

(56) References Cited

U.S. PATENT DOCUMENTS 4,895,307 A * 1/1990 Swinehart ................. B60S 3/04
                                                      239/263.1
5,143,657 A * 9/1992 Curtis ....................... B05B 1/265
                                                      261/DIG. 11
(Continued)

FOREIGN PATENT DOCUMENTS

CN    110290677 A    9/2019
CN    111328248 A    6/2020
(Continued)

OTHER PUBLICATIONS

International Search Report (Chinese and English) and Written Opinion (Chinese) of the ISA issued in PCT/CN2021/138326, dated Mar. 1, 2022; ISA/CN.

*Primary Examiner* — Joel M Attey
(74) *Attorney, Agent, or Firm* — Harness, Dickey & Pierce, P.L.C.

(57) ABSTRACT

The present application discloses a rotary liquid distributor for a liquid-cooled tank, and a liquid-cooled tank. The rotary liquid distributor includes a liquid distribution cavity and a liquid distribution arm provided in the liquid distribution cavity. The liquid distribution cavity rotates around a central
(Continued)

shaft thereof. A plurality of the liquid distribution arms are uniformly distributed in a circumferential direction of the liquid distribution cavity. That is, the liquid distribution arm rotates with the liquid distribution cavity. Then, a liquid distribution outlet is provided between a first end and a second end of the liquid distribution arm. The liquid distribution outlet is located on a side of the liquid distribution arm facing away from a rotating direction.

14 Claims, 5 Drawing Sheets

(51) Int. Cl.
    *F28F 25/06*     (2006.01)
    *F28F 25/02*     (2006.01)
    *F28D 5/00*     (2006.01)
    *H01L 23/44*     (2006.01)

(52) U.S. Cl.
    CPC ... *F25B 2313/004* (2013.01); *F25B 2339/041* (2013.01); *F28D 5/00* (2013.01); *H01L 23/44* (2013.01); *H05K 7/203* (2013.01); *H05K 7/20236* (2013.01)

(58) Field of Classification Search
    USPC .......................................................... 165/80.4
    See application file for complete search history.

(56) References Cited

U.S. PATENT DOCUMENTS

| | | | |
|---|---|---|---|
| 5,152,458 A * | 10/1992 | Curtis | .................... B05B 3/001 261/DIG. 11 |
| 2013/0000866 A1 * | 1/2013 | Wiltz | ...................... F28F 25/06 165/85 |
| 2019/0364699 A1 | 11/2019 | Gao | |

FOREIGN PATENT DOCUMENTS

| CN | 111356343 A | 6/2020 |
|---|---|---|
| CN | 214627764 U | 11/2021 |
| CN | 214627765 U | 11/2021 |

* cited by examiner

ROTARY LIQUID DISTRIBUTOR FOR LIQUID-COOLED TANK AND LIQUID-COOLED TANK

CROSS-REFERENCE TO RELATED APPLICATIONS

This application is a 371 U.S. National Phase of International Application No. PCT/CN2021/138326, filed on Dec. 15, 2021, which claims priority to Chinese Patent Application No. 202110060886.9, filed to the China Patent Office on Jan. 18, 2021, entitled "Rotary Liquid Distributor for Liquid-Cooled Tank and Liquid-Cooled Tank", the entire disclosures of the above applications are incorporated herein by reference.

TECHNICAL FIELD

The present application relates to the technical field of liquid-cooled heat dissipation, and more particularly to a rotary liquid distributor for a liquid-cooled tank, and a liquid-cooled tank.

BACKGROUND

Electronic devices typically have heat dissipation requirements during operation due to heat generation.

For example, a single-phase immersion-type liquid-cooled heat dissipation mode has been used. That is, an electronic device is placed in a liquid-cooled tank having a lower inlet and an upper outlet. A cooling liquid enters the lower inlet of the tank to immerse the electronic device from bottom to top, and then flows out of the upper outlet of the tank. Thus, the cooling liquid exchanges heat with the electronic device in the circular flow, thereby dissipating heat from the electronic device.

SUMMARY

An embodiment of the present application provides a rotary liquid distributor for a liquid-cooled tank. The rotary liquid distributor includes:

a liquid distribution cavity, the liquid distribution cavity having a central shaft, and the liquid distribution cavity rotating around the central shaft in a first direction;

a liquid distribution arm, a plurality of the liquid distribution arms being uniformly distributed in a circumferential direction of the liquid distribution cavity relative to the central shaft, the liquid distribution arm rotating with the liquid distribution cavity, a first end of the liquid distribution arm communicating with the liquid distribution cavity, and a second end of the liquid distribution arm being closed.

A liquid distribution outlet is provided between the first end and the second end of the liquid distribution arm, and the liquid distribution outlet is located on a side of the liquid distribution arm facing away from the first direction.

The liquid distribution outlet allows a cooling liquid flowing into the liquid distribution cavity to flow out of the rotary liquid distributor.

An embodiment of the present application also provides a liquid-cooled tank. A bottom end of the liquid-cooled tank is provided with a liquid inlet allowing the circular inflow of a cooling liquid, and a top end of the liquid-cooled tank is provided with a liquid outlet allowing the circular outflow of the cooling liquid. The liquid inlet communicates with a liquid distributor at the bottom end of the liquid-cooled tank. The liquid distributor is the rotary liquid distributor described above.

BRIEF DESCRIPTION OF THE DRAWINGS

In order to illustrate the technical solutions in the embodiments of the present application more clearly, the drawings needing to be used in the description of the embodiments of the present application will be briefly introduced below. It is apparent that the drawings in the following description are merely some embodiments of the present application. Those ordinarily skilled in the art may also obtain other drawings according to these drawings without involving any inventive effort.

REFERENCE NUMERALS

Figure 1:
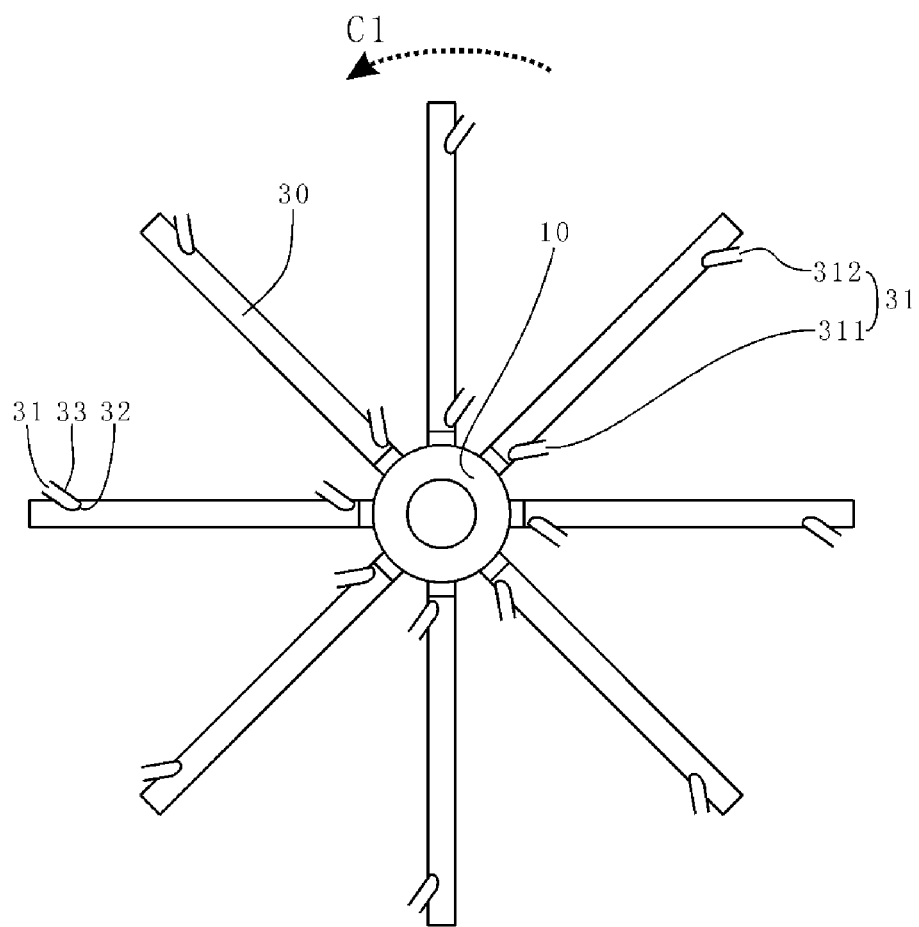
FIG. 1 is a top view structure diagram of a rotary liquid distributor according to an embodiment of the present application.

10: liquid distribution cavity, 11: central shaft, 12: second diversion port, 13: diversion cover,
20: liquid distribution inlet,
30: liquid distribution arm, 31: liquid distribution outlet, 32: first diversion port, 33: liquid distribution sub-pipe,
311: first liquid distribution outlet, 312: second liquid distribution outlet,
40: liquid inlet sub-pipe,
50: liquid inlet main pipe,
60: liquid-cooled tank, 61: liquid inlet, 62: liquid outlet, 63: liquid distribution region, 64: heat dissipation region, 65: overflow liquid return trough, 67: first side wall, 68: second side wall,
C1: first direction,
C2: second direction,
E: conical surface E, F: conical surface F.

DETAILED DESCRIPTION

In order to better understand the technical solution above, exemplary embodiments of the present application will now be described in detail with reference to the accompanying drawings. It is obvious that the embodiments described are merely a few, but not all embodiments of the present application. It should be understood that the present application is not limited to the exemplary embodiments described herein.

In the related art, a cooling liquid is generally introduced from one side of a liquid-cooled tank. At this moment, for the same horizontal position, the heat dissipation between electronic devices or between different positions of the same electronic device is not uniform. In order to maintain the overall heat dissipation requirements of the electronic device, the cooling capacity of the cooling liquid needs to be generally increased, which results in the waste of resources.

Therefore, embodiments of the present application provide a rotary liquid distributor for a liquid-cooled tank, and a liquid-cooled tank. The rotary liquid distributor includes a liquid distribution cavity, and a liquid distribution arm provided in the liquid distribution cavity. The liquid distribution cavity rotates around a central shaft thereof. A plurality of the liquid distribution arms are uniformly distributed in a circumferential direction of the liquid distribution cavity. That is, the liquid distribution arm rotates with the liquid distribution cavity. Then, a liquid distribution outlet is set between a first end and a second end of the liquid distribution arm. The liquid distribution outlet is located on a side of the liquid distribution arm facing away from a rotating direction.

In this way, when the liquid distribution cavity rotates around the central shaft, the cooling liquid flows into the liquid distribution cavity and then flows out of the liquid distribution outlet rotating with the liquid distribution cavity. By setting rotation of the flow outlet of the cooling liquid, the temperature of the cooling liquid may be better equalized in a rotating region covered by the rotating liquid distribution arm. It can be understood that the temperature-equalized cooling liquid performs uniform heat dissipation between electronic devices or between different positions of the same electronic device, thereby improving the uniformity of liquid-cooled heat dissipation of electronic devices, and reducing resource waste.

An embodiment of the present application provides a rotary liquid distributor for a liquid-cooled tank. The rotary liquid distributor includes a liquid distribution cavity 10 and a liquid distribution arm 30. The liquid distribution cavity 10 has a central shaft 11. The liquid distribution cavity 10 rotates around the central shaft 11 in a first direction. A plurality of the liquid distribution arms 30 are uniformly distributed in a circumferential direction of the liquid distribution cavity 10 relative to the central shaft 11. The liquid distribution arm 30 rotates with the liquid distribution cavity 10. A first end of the liquid distribution arm 30 communicates with the liquid distribution cavity 10, and a second end of the liquid distribution arm 30 is closed. A liquid distribution outlet 31 is set between the first end and the second end of the liquid distribution arm 30. The liquid distribution outlet 31 is located on a side of the liquid distribution arm 30 facing away from the first direction. That is, an instantaneous flow direction of the cooling liquid flowing out of the liquid distribution outlet 31 is opposite to the first direction. The liquid distribution outlet 31 is configured to allow a cooling liquid flowing into the liquid distribution cavity to flow out of the rotary liquid distributor.

Figure 2:
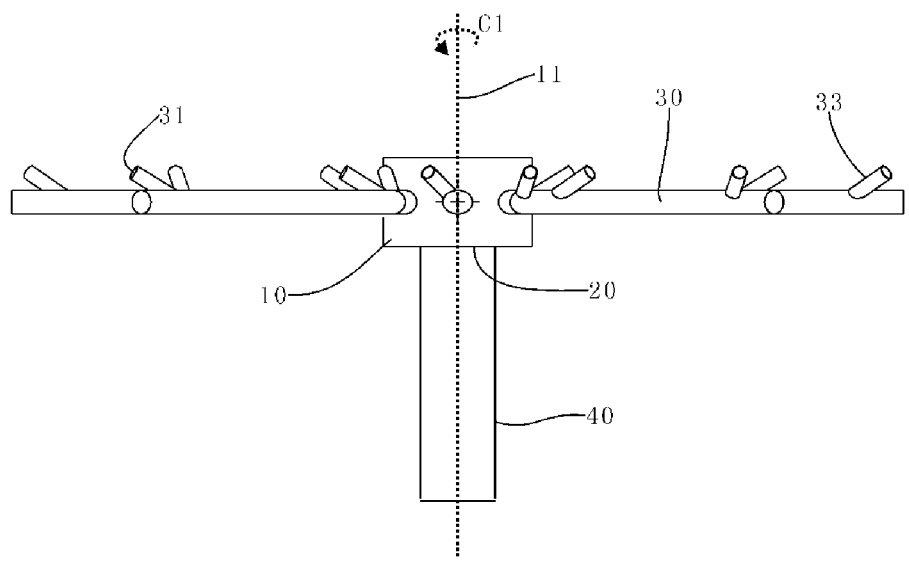
FIG. 2 is a side view structure diagram of a rotary liquid distributor according to an embodiment of the present application.

In the present embodiment, with reference to FIG. 1, the rotary liquid distributor includes a liquid distribution cavity. An accommodating space for accommodating a cooling liquid is provided inside the liquid distribution cavity. The liquid distribution cavity is rotatable around a central shaft. For example, with reference to FIGS. 1 and 2, the liquid distribution cavity rotates around the central shaft in a first direction C1 (counterclockwise direction in FIG. 1). Then, one end (lower end in FIG. 2) of the liquid distribution cavity is provided with a liquid distribution inlet along the central shaft. A plurality of liquid distribution arms are uniformly distributed in a circumferential direction of the liquid distribution cavity. One end of the liquid distribution arm communicates with the accommodating space of the liquid distribution cavity, and the other end of the liquid distribution arm is closed. Moreover, a liquid distribution outlet is further provided between two ends of the liquid distribution arm. The liquid distribution outlet is located on one side of the liquid distribution arm facing away from the first direction. That is, with reference to FIG. 1, in the plurality of liquid distribution arms, the liquid distribution outlet is provided on one side of the corresponding liquid distribution arm facing away from a rotating direction C1. In this way, it will be understood that as the liquid distribution arm rotates with the liquid distribution cavity, the rotating liquid distribution arm forms a rotating region where the cooling liquid flowing out of the liquid distribution outlet can then be uniformly distributed, so that the cooling liquid can uniformly dissipate heat from an electronic device located in the rotating region.

In the present embodiment, the rotary liquid distributor is used in a liquid-cooled tank. Specifically, in conjunction with FIGS. 8 and 9, the liquid-cooled tank is, for example, square. A bottom end of a liquid-cooled tank 60 is provided with a liquid inlet 61, and a top end is provided with a liquid outlet 62. A heat dissipation region 64 of the liquid-cooled tank 60 is provided with an electronic device to be subjected to heat dissipation. A cooling liquid flows into a liquid distribution region 63 from the liquid inlet at the bottom end, gradually rises from bottom to top, absorbs the heat of the electronic device, flows out of the liquid outlet at the top end, and then is cooled by an external refrigeration device, thus circulating. Specifically, the rotary liquid distributor of the present embodiment should be located in the liquid distribution region 63 at the bottom of the liquid-cooled tank, and a liquid distribution inlet 20 communicates with the liquid inlet 61 of the liquid-cooled tank. The cooling liquid flows into the rotary liquid distributor from the liquid inlet via the liquid distribution inlet, and then flows out of the rotating liquid distribution outlet, thereby achieving the effect that the cooling liquid is uniformly distributed in the above rotating region, so that the cooling liquid uniformly distributed gradually rises from bottom to top and absorbs heat of the electronic device, so as to dissipate the heat of the electronic device evenly.

In some embodiments, aiming at the uniform distribution of the cooling liquid in the rotating region above, the position and number of the liquid distribution outlets (see FIGS. 1 and 3) on the liquid distribution arm should be set as required. That is, the position and number of the liquid distribution outlets on the liquid distribution arm should be determined according to actual requirements or the structure of the liquid-cooled tank.

Figure 8:
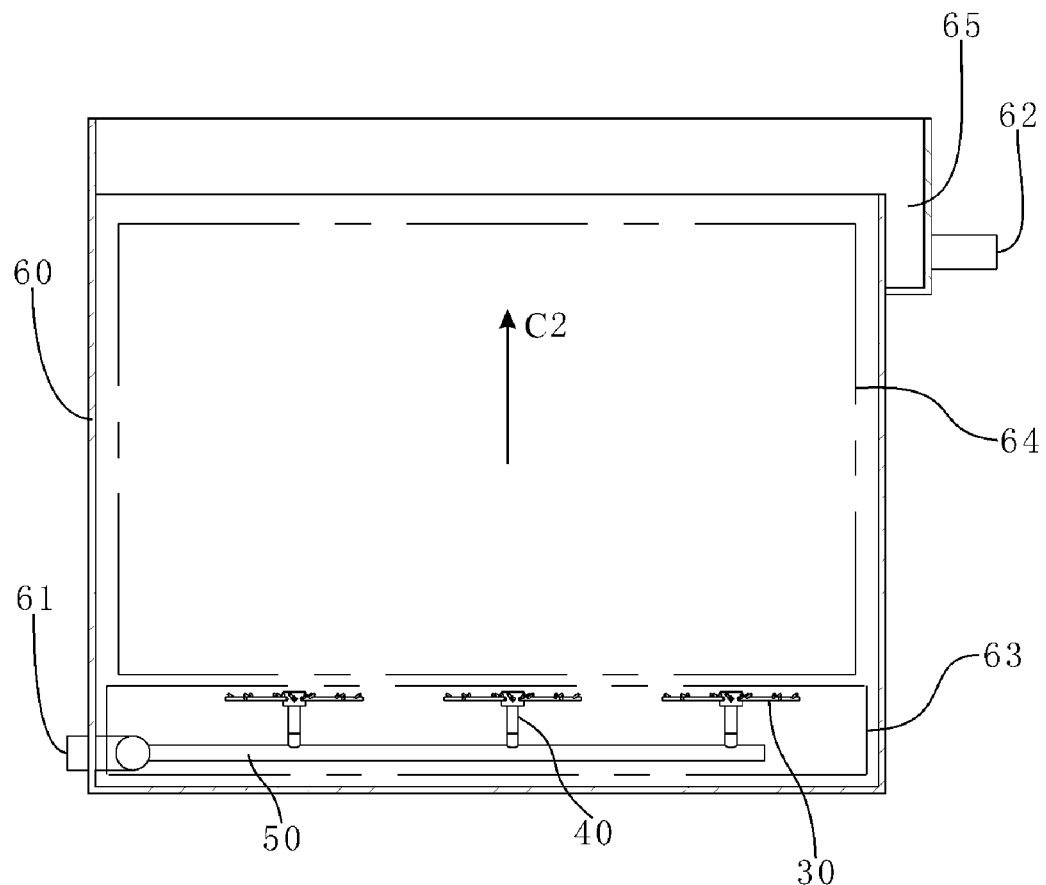
FIG. 8 is a side view structure diagram of a liquid-cooled tank according to an embodiment of the present application.
Figure 9:
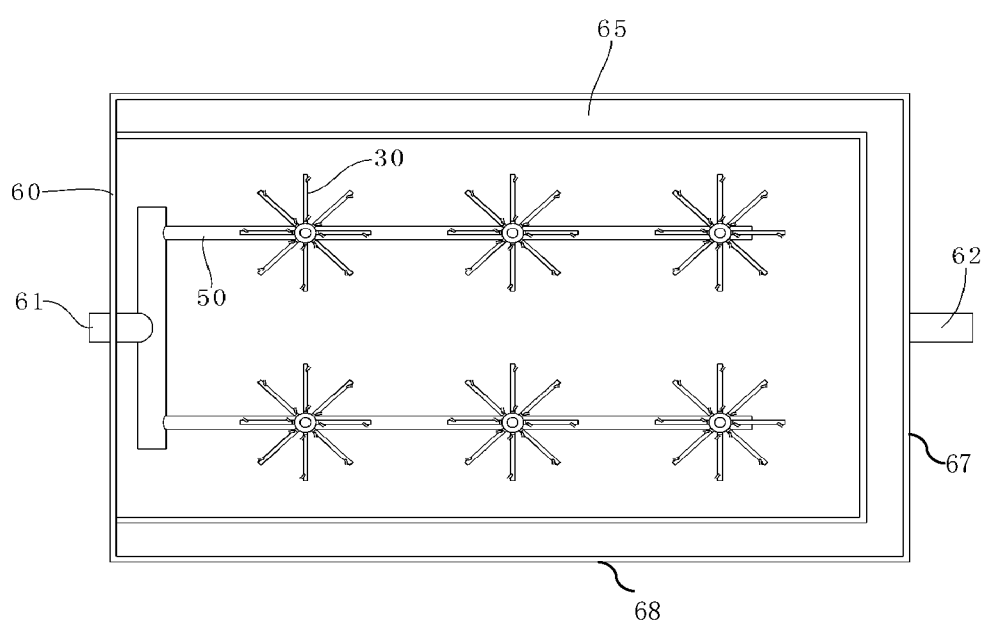
FIG. 9 is a top view structure diagram of a liquid-cooled tank according to an embodiment of the present application.

In some embodiments, a plurality of rotary liquid distributors should be uniformly set on the cross section of the liquid-cooled tank in the flow direction of the cooling liquid (see FIGS. 8 and 9). Moreover, the length of a liquid distribution arm of each rotary liquid distributor may be determined according to actual requirements.

Embodiments of the present application provide a rotary liquid distributor for a liquid-cooled tank, and a liquid-cooled tank. The rotary liquid distributor includes a liquid distribution cavity, and a liquid distribution inlet and a liquid distribution arm provided in the liquid distribution cavity. The liquid distribution cavity rotates around a central shaft thereof. The liquid distribution inlet is provided at one end of the liquid distribution cavity along the central shaft. A plurality of the liquid distribution arms are distributed in a circumferential direction of the liquid distribution cavity uniformly. That is, the liquid distribution arm rotates with the liquid distribution cavity. Then, a liquid distribution outlet is provided between a first end and a second end of the liquid distribution arm. The liquid distribution outlet is located on a side of the liquid distribution arm facing away from a rotating direction.

In this way, when the liquid distribution cavity rotates around the central shaft, the cooling liquid flows into the liquid distribution cavity from the liquid distribution inlet and then flows out of the liquid distribution outlet rotating with the liquid distribution cavity. By setting rotation of the flow outlet of the cooling liquid, the temperature of the cooling liquid may be better equalized in a rotating region covered by the rotating liquid distribution arm. It can be understood that the temperature-equalized cooling liquid performs uniform heat dissipation between electronic devices or between different positions of the same electronic device, thereby improving the uniformity of liquid-cooled heat dissipation. Thus, the technical problem of resource waste caused by non-uniform liquid-cooled heat dissipation is solved, and the technical effects of improving the uniformity of liquid-cooled heat dissipation of an electronic device and reducing resource waste are achieved.

In the present embodiment, it will be readily understood that on one hand, the liquid distribution cavity may be driven to rotate around the central shaft at a constant speed by an external driving unit such as a driving motor. The rotation speed of the liquid distribution cavity may be determined according to actual requirements. Alternatively on the other hand, the liquid distribution cavity may be driven to auto-rotate by a reverse thrust force when the cooling liquid flows out. Then, the liquid distribution cavity and the liquid distribution arm are subjected to a resistance force of the cooling liquid when rotating. When the resistance force and the reverse thrust force are balanced, the liquid distribution cavity is in a state of rotating at a constant speed.

In the present embodiment, it will be readily understood that the orientation of the liquid distribution outlet in the liquid distribution arm is opposite to the first direction of rotation of the liquid distribution arm, thereby facilitating the outflow of the cooling liquid from the liquid distribution outlet and facilitating the substantially uniform distribution of the cooling liquid in the above rotating region.

In a possible implementation, the liquid distribution outlet 31 includes at least a first liquid distribution outlet 311 at the first end of the liquid distribution arm 30.

That is, in the present embodiment, if the liquid distribution cavity rotates at a constant speed under the driving of an external driving motor or the like. At this moment, in order to ensure the uniform distribution of the cooling liquid in the rotating region of the liquid distribution arm, it can be understood that at least one first liquid distribution outlet should be provided on the liquid distribution arm, and the first liquid distribution outlet should be as close to the liquid distribution cavity as possible, so as to ensure the uniform distribution of the cooling liquid at the center of the rotating region.

In a possible implementation, the liquid distribution outlet 31 includes at least a first liquid distribution outlet 311 at the first end of the liquid distribution arm 30 and a second liquid distribution outlet 312 at the second end of the liquid distribution arm 30.

That is, in the present embodiment, if the liquid distribution cavity auto-rotates by means of a reverse thrust force when the cooling liquid flows out, with reference to FIG. 1, at least two liquid distribution outlets should be provided on the liquid distribution arm. One of the liquid distribution outlets is close to the liquid distribution cavity, and the other liquid distribution outlet is far away from the liquid distribution cavity. At this moment, the cooling liquid flowing out of the second liquid distribution outlet away from the liquid distribution cavity has a great torque on the rotary liquid distributor and can generate a great rotating driving force, and the cooling liquid flowing out of the first liquid distribution outlet close to the liquid distribution cavity can ensure the uniformity of the cooling liquid flowing over the rotating region of the liquid distribution arm. That is, in the present embodiment, by the provision of the first liquid distribution outlet and the second liquid distribution outlet, it is possible to ensure the uniformity of the cooling liquid flowing over the rotating region of the liquid distribution arm while ensuring the auto-rotation of the liquid distribution cavity, so that an external driving unit can be omitted, thus saving hardware resources and reducing energy consumption.

Figure 3:
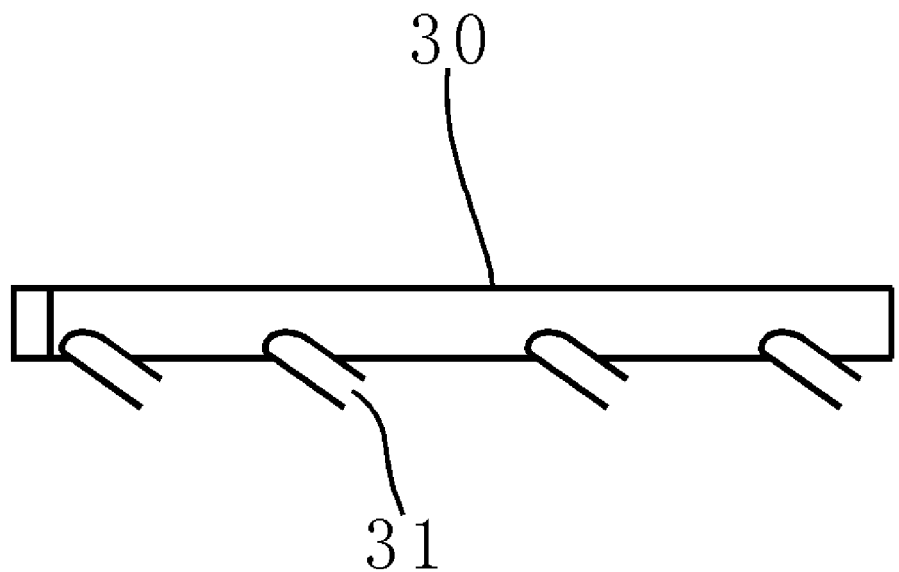
FIG. 3 is another structure diagram of a liquid distribution arm according to an embodiment of the present application.

Furthermore, with reference to FIG. 3, other liquid distribution outlets may be provided between the first liquid distribution outlet 311 and the second liquid distribution outlet 312 as required.

Figure 4:
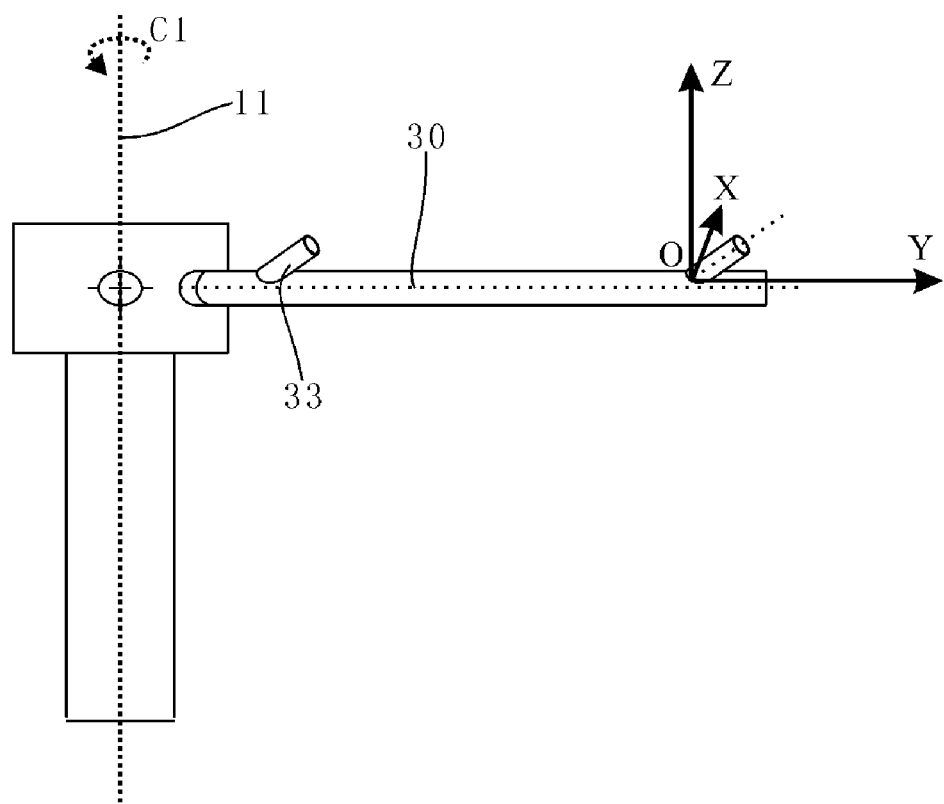
FIG. 4 is a structure diagram of forming a predetermined angle between an axis of a liquid distribution sub-pipe and an axis of a liquid distribution arm according to an embodiment of the present application.

With regard to the liquid distribution cavity auto-rotating by means of a reverse thrust force when the cooling liquid flows out, specifically, with reference to FIGS. 1 and 4, for example, when the cooling liquid is sprayed from the liquid distribution outlet, the cooling liquid generates a reverse thrust force to the liquid distribution outlet according to momentum conservation, the reverse thrust force further acts on the liquid distribution arm, and the direction of action of the reverse thrust force is opposite to the flow direction of the cooling liquid. The reverse thrust force causes the liquid distribution arm to drive the liquid distribution cavity to generate a rotation effect around the central shaft. The rotation effect is quantified by a torque, the torque is equal to a force multiplied by an action distance of the force, and the torque causes the liquid distribution arm to obtain an angular acceleration rotating around the central shaft. As the liquid distribution arm accelerates to rotate in the cooling liquid (the liquid distribution cavity rotates together), the resistance force of the cooling liquid to the liquid distribution arm and the resistance force to the liquid distribution cavity are also increased, and the direction of two resistance forces is opposite to the direction of the above reverse thrust force. That is, the two resistance forces may generate a rotation effect opposite to the reverse thrust force. When the three rotation effects are balanced, the liquid distribution cavity and the liquid distribution arm rotate at a constant speed.

Thus, as the second liquid distribution outlet is farther away from the liquid distribution cavity, a larger reverse thrust force is generated. Moreover, a total reverse thrust force obtained by the rotary liquid distributor should be obtained by the superposition of a plurality of liquid distribution outlets on a plurality of liquid distribution arms. Further, a final rotation state of the rotary liquid distributor is comprehensively determined by the number of liquid distribution arms, the state of the cooling liquid, the number and position of liquid distribution outlets on each liquid distribution arm, etc.

In some embodiments, when the liquid distribution cavity 10 and the liquid distribution arm 30 rotate at a constant speed, a linear rotation speed of the second liquid distribution outlet 312 in the first direction is not less than a flow speed of the cooling liquid.

In the present embodiment, the number of liquid distribution arms and the number of liquid distribution outlets should be set in the following manner. When the liquid distribution cavity and the liquid distribution arm rotate at a constant speed, the linear rotation speed of the liquid distribution outlet on the liquid distribution arm furthest from the liquid distribution cavity should be not less than the flow speed of the cooling liquid, so that the cooling liquid can be prevented from accumulating at the position of the liquid distribution outlet, and the distribution uniformity of the cooling liquid can be improved.

With regard to the liquid distribution outlet 31 in the embodiments above, it will be understood that the liquid distribution outlet 31 may be directly provided on the liquid distribution arm 30. Or, in a possible implementation, a first diversion port 32 is provided between the first end and the second end of the liquid distribution arm 30. The first diversion port 32 is externally connected with a liquid distribution sub-pipe 33 relative to the liquid distribution arm 30. The liquid distribution outlet 31 is provided at an outer end portion of the liquid distribution sub-pipe 33. An axis of the liquid distribution sub-pipe 33 forms a predetermined angle with an axis of the liquid distribution arm 30.

That is, in the present embodiment, in conjunction with FIGS. 1 and 4, a bifurcated liquid distribution sub-pipe may be provided on the liquid distribution arm. One end of the liquid distribution sub-pipe is connected to the first diversion port on the liquid distribution arm. Then, the liquid distribution outlet is located at the other end of the liquid distribution sub-pipe. By means of a gathering effect of the liquid distribution sub-pipe on the cooling liquid, the spraying area of the cooling liquid can be expanded, and the area of uniform heat dissipation of the cooling liquid can be increased.

Also, the axis of the liquid distribution sub-pipe forms a predetermined angle with the axis of the liquid distribution arm. It will be understood that in connection with FIG. 5, the liquid distribution sub-pipe may now be located on a conical surface E or a conical surface F at a predetermined angle with the axis of the liquid distribution arm as a central shaft. Also, in conjunction with the liquid distribution outlet being located on a side of the liquid distribution arm facing away from the first direction, the liquid distribution sub-pipe should be located in a negative region of an X axis in the conical surface E or the conical surface F.

It should be understood that with regard to the predetermined angle above, when one liquid distribution arm is provided with a plurality of liquid distribution sub-pipes, respective predetermined angles corresponding to the plurality of liquid distribution sub-pipes may be the same, or respective predetermined angles corresponding to the plurality of liquid distribution sub-pipes may be different.

Further, in a possible implementation, the liquid distribution outlet 31 is inclined towards the second end of the liquid distribution arm 30 relative to the first diversion port 32 on the same liquid distribution sub-pipe 33.

In the present embodiment, in conjunction with FIG. 1, an opening (i.e. liquid distribution outlet) of the liquid distribution sub-pipe is provided radially outwards relative to the rotating region of the liquid distribution arm, such as a rotating plane, so that the spraying area of the cooling liquid can be expanded. That is, in conjunction with FIG. 5, the liquid distribution sub-pipe 33 should be located in the negative region of the X axis in the conical surface F.

Further, in a possible implementation, the rotary liquid distributor is provided at the bottom end of the liquid-cooled tank 60, and the central shaft 11 is provided in a direction from the bottom end to the top end of the liquid-cooled tank 60. Also, the liquid distribution outlet 31 is inclined towards the top end of the liquid-cooled tank 60 relative to the first diversion port 32 on the same liquid distribution sub-pipe 33.

Figure 5:
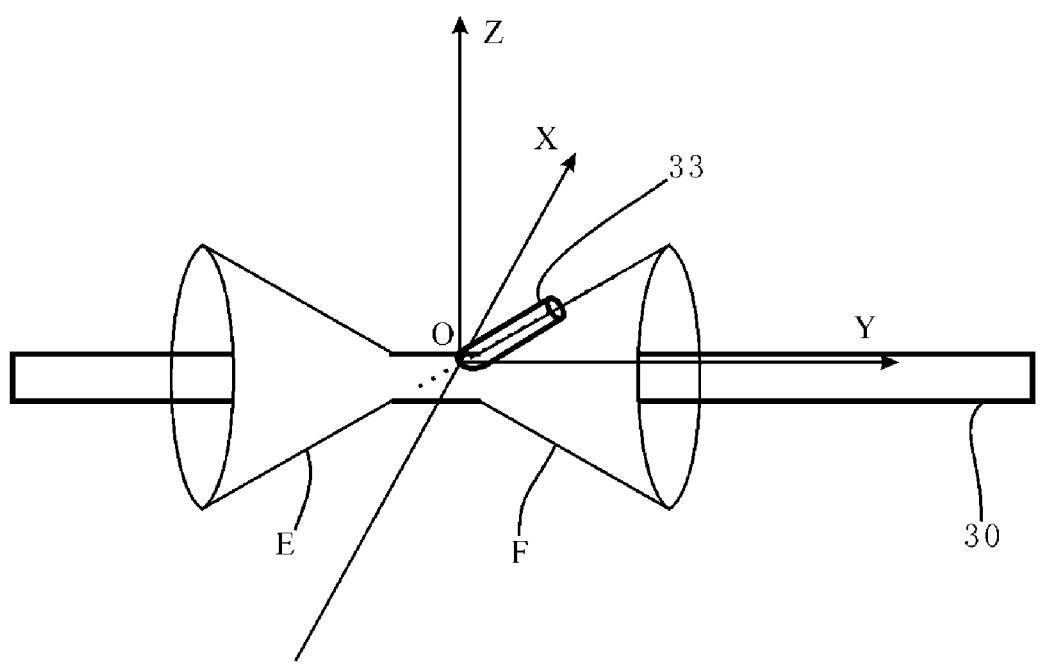
FIG. 5 is a structure diagram of a conical surface E and a conical surface F according to an embodiment of the present application.

In the present embodiment, in conjunction with FIGS. 5 and 8, an opening (i.e. liquid distribution outlet) of the liquid distribution sub-pipe 33 is provided towards the top end of the liquid-cooled tank 60 relative to the rotating region of the liquid distribution arm, such as a rotating plane. That is, the orientation of the liquid distribution outlet 31 is the same as the flow direction (direction C2 in FIG. 8) of the cooling liquid in the liquid-cooled tank, so that the circulation resistance of the cooling liquid can be reduced. That is, in conjunction with FIG. 5, the liquid distribution sub-pipe 33 should be located in a positive region of a Z axis in the conical surface F.

In summary, in conjunction with the above and FIG. 5, it should be understood that the first diversion port is taken as an origin O, a rotational tangential direction of the first diversion port is an X axis, that is, a tangential direction of C1 perpendicular to the liquid distribution arm is an X axis, the direction of the axis of the liquid distribution arm is a Y axis, a positive direction of the Y axis is radially outward, the direction of the central shaft of the liquid distribution cavity is a Z axis, and a positive direction of the Z axis is a circulation flow direction C2 of the cooling liquid. Then, in the above coordinate system, firstly, the space angle of the liquid distribution sub-pipe should have a negative component of the X axis, so as to ensure that the liquid distribution outlet is located on a side of the liquid distribution arm facing away from the first direction. Then, the space angle of the liquid distribution sub-pipe should have a positive component of the Y axis, so as to expand the spraying area of the cooling liquid. And then, the space angle of the liquid distribution sub-pipe should have a positive component of the Z axis, so as to reduce the circulation resistance of the cooling liquid.

In a possible implementation, the cross section of the liquid distribution cavity 10 is circular in the direction of the central shaft 11; and/or, the cross section of the liquid distribution arm 30 is oval in the direction of the axis of the liquid distribution arm 30, and a minor axis of the oval is parallel to the central shaft 11 of the liquid distribution cavity 10.

Figure 6:
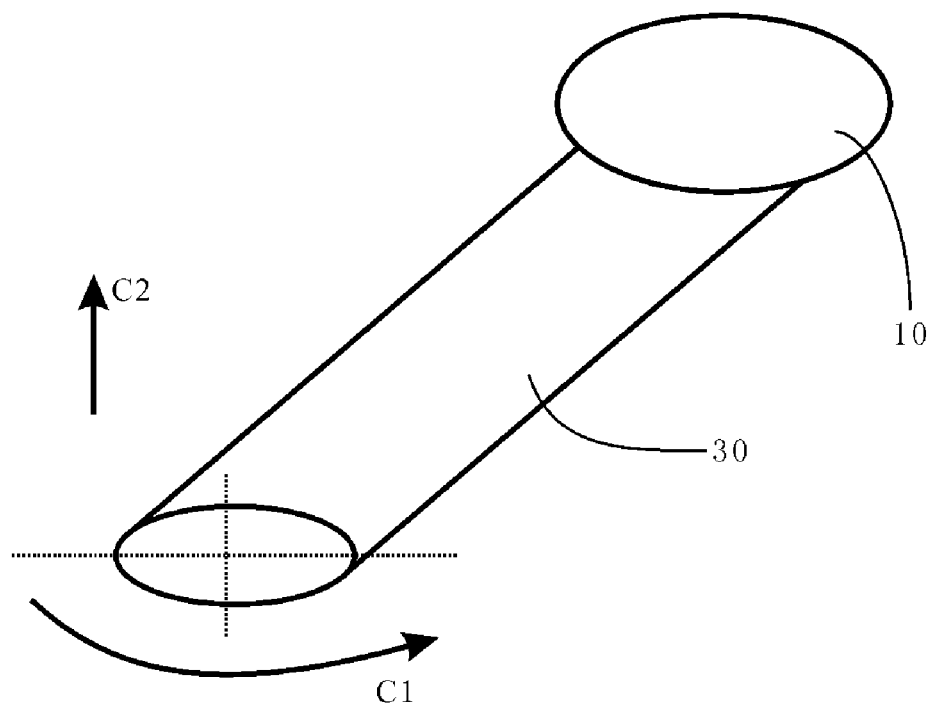
FIG. 6 is a cross-sectional structure diagram of a liquid distribution arm according to an embodiment of the present application.

In the present embodiment, the liquid distribution cavity is cylindrical. Then, with reference to FIG. 6, the liquid distribution arm is oval, and a minor axis of the oval is parallel to the central shaft of the liquid distribution cavity, so as to reduce the frictional resistance during rotation, thereby increasing the rotation speed of the liquid distribution cavity rotating at a constant speed in a balanced state.

Further, the cross section of the liquid distribution sub-pipe may be set to be oval in the direction of the axis of the liquid distribution sub-pipe, and a minor axis of the oval is parallel to the central shaft 11 of the liquid distribution cavity 10.

In a possible implementation, a plurality of second diversion ports 12 are uniformly distributed in the circumferential direction of the liquid distribution cavity 10 relative to the central shaft 11, and the first end of the liquid distribution arm 30 is connected to the second diversion port 12. The plurality of second diversion ports 12 are distributed centrally symmetrically relative to the central shaft 11 in the circumferential direction of the liquid distribution cavity 10. The first end of the liquid distribution arm 30 is detachably connected to the second diversion port 12. Also, the rotary liquid distributor further includes a diversion cover 13. The diversion cover 13 is configured to close the second diversion port 12 to which the liquid distribution arm 30 is not connected.

Figure 7:
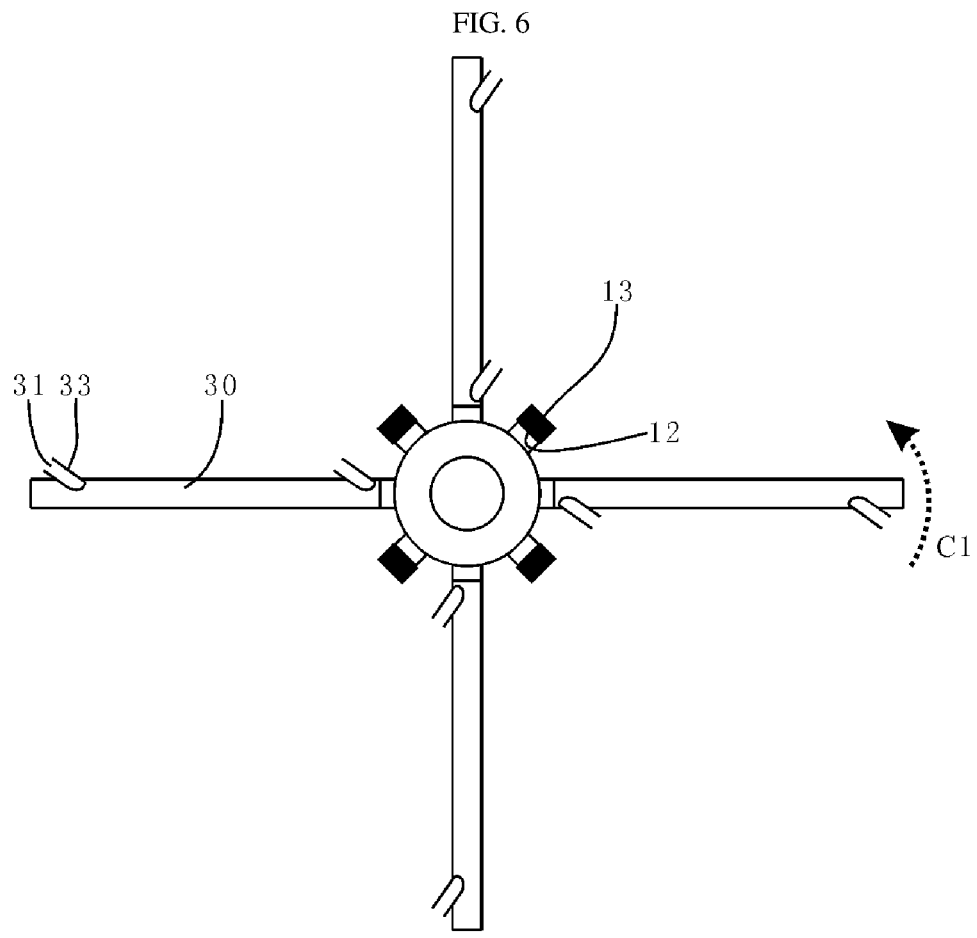
FIG. 7 is a structure diagram of a diversion cover closing a second diversion port to which a liquid distribution arm is not connected according to an embodiment of the present application.

Specifically, with reference to FIG. 7, a plurality of second diversion ports may be provided in the circumferential direction of the liquid distribution cavity. Then, the first end of the liquid distribution arm is connected to the second diversion port by, for example, plugging or screwing. In this way, by means of the liquid distribution arm being detachably connected, different numbers of liquid distribution arms may be connected to the liquid distribution cavity according to actual requirements, and the second diversion port to which the liquid distribution arm is not connected may be closed by the diversion cover. Furthermore, the plurality of second diversion ports may be distributed centrally symmetrically relative to the central shaft.

In conjunction with the above description about the first diversion port, it can be seen that the cooling liquid is first diverted from the liquid distribution cavity to different liquid distribution arms via a plurality of second diversion ports. Then, in the same liquid distribution arm, the cooling liquid flows out of the rotary liquid distributor from the liquid distribution arm via a plurality of first diversion ports.

In a possible implementation, the rotary liquid distributor is provided at the bottom end of the liquid-cooled tank 60, and the central shaft 11 is provided in a second direction from the bottom end to the top end of the liquid-cooled tank 60. A plurality of the rotary liquid distributors are uniformly arranged in a plane perpendicular to the second direction.

That is, in conjunction with FIGS. 8 and 9, according to practical situations, a plurality of rotary liquid distributors may be provided in the liquid-cooled tank. The plurality of rotary liquid distributors are uniformly arranged in a plane perpendicular to a second direction C2 (vertical direction in FIG. 8). The second direction is a direction from the bottom end to the top end of the liquid-cooled tank, or the second direction is a circulation flow direction of the cooling liquid in the liquid-cooled tank.

Specifically, the liquid distribution cavity 10 is provided with a liquid distribution inlet 20. The liquid distribution inlet 20 is provided at an end of the liquid distribution cavity facing away from the second direction. The liquid distribution inlet 20 is externally connected with a liquid inlet sub-pipe 40. The liquid inlet sub-pipe 40 communicates with a liquid inlet main pipe 50. The liquid inlet main pipe 50 also communicates with a liquid inlet 61 at the bottom end of the liquid-cooled tank 60. Moreover, the axis of the liquid inlet sub-pipe 40 coincides with the central shaft 11 whereby the liquid distribution cavity 10 rotates around the liquid inlet sub-pipe 40 in the first direction.

That is, for example, the liquid distribution inlet is provided at an end of the liquid distribution cavity facing away from the circulation flow direction of the cooling liquid. The liquid distribution inlet communicates with the liquid inlet main pipe via the liquid inlet sub-pipe, and a plurality of rotary liquid distributors may be connected to the liquid inlet main pipe. Then, the liquid inlet main pipe communicates with the liquid inlet of the liquid-cooled tank. In this way, the cooling liquid flows from the liquid inlet into the liquid distribution cavity via the liquid inlet main pipe and the liquid inlet sub-pipe successively, flows from the liquid distribution cavity into the liquid distribution region 63 via the rotating liquid distribution outlet, gradually rises from the liquid distribution region 63 to the heat dissipation region 64, and finally flows out of the liquid outlet, thus circulating.

An embodiment of the present application also discloses a liquid-cooled tank. A bottom end of the liquid-cooled tank 60 is provided with a liquid inlet 61 allowing the circular inflow of a cooling liquid, and a top end of the liquid-cooled tank 60 is provided with a liquid outlet 62 allowing the circular outflow of the cooling liquid. The liquid inlet 61 communicates with a liquid distributor at the bottom end of the liquid-cooled tank 60. The liquid distributor is the rotary liquid distributor described above.

In a possible implementation, the liquid-cooled tank 60 includes a side wall. An overflow liquid return trough 65 is provided on an outer side of a top end of the side wall whereby the cooling liquid overflows from the top end of the side wall and flows into the overflow liquid return trough 65. The liquid outlet 62 is provided at a lower end of the overflow liquid return trough 65.

With reference to FIG. 8, an overflow liquid return trough with a double-layer structure is provided on an outer side of the top end of the side wall of the liquid-cooled tank. Then, a liquid outlet is provided at a lower end of the overflow liquid return trough. In this way, when the cooling liquid is filled in the liquid-cooled tank, the cooling liquid overflows from the side wall of the liquid-cooled tank, flows into the overflow liquid return trough at the same time, and finally flows from the liquid outlet at the lower end of the overflow liquid return trough to an external refrigeration device.

In the present embodiment, the overflow liquid return trough provides a space for sufficient contact and heat exchange of the returned cooling liquid, which improves the temperature uniformity of the returned cooling liquid, thereby facilitating the external refrigeration device to unify the refrigeration power for the cooling liquid, improving the refrigeration efficiency, and further increasing the circulation speed of the cooling liquid and the heat dissipation speed of an electronic device.

In a possible implementation, the overflow liquid return trough 65 circumferentially surrounds at least three side walls; or, The liquid-cooled tank 60 is a rectangular parallelepiped. The liquid-cooled tank 60 includes a first side wall and a second side wall in pair. The length of the first side wall is greater than the length of the second side wall. The overflow liquid return trough 65 is provided outside the first side wall.

That is, in conjunction with FIG. 9, the liquid-cooled tank may generally have a square structure, and the overflow liquid return trough circumferentially surrounds three side walls. Or, the liquid-cooled tank is a cube, and the overflow liquid return trough circumferentially surrounds four side walls. Or, the liquid-cooled tank is a rectangular parallelepiped, and includes a first side wall 67 and a second side wall 68 in pair. When the length of the first side wall 67 of the rectangular parallelepiped is significantly different from the length of the second side wall 68, the overflow liquid return trough should be provided on the outer side of the second side wall 68 and a side wall opposite to the second side wall 68. That is, the overflow liquid return trough should be provided outside side walls of two long sides.

In the present embodiment, the cooling liquid that has absorbed heat from the electronic device is allowed to overflow into the overflow liquid return trough with a minimal travel, thereby facilitating the rapid and concentrated discharge of the hotter cooling liquid from the liquid-cooled tank.

While the basic principles of the present application have been described above in conjunction with specific embodiments, it should be noted that the merits, advantages, effects, etc. mentioned in the present application are merely exemplary and not limiting, and are not to be construed as being necessarily possessed by the various embodiments of the present application. In addition, specific details disclosed above are for purposes of illustration and understanding merely and are not intended to be limiting, and the above details do not limit the present application to be implemented by using the specific details above.

The block diagrams of devices, apparatuses, equipment, and systems referred to in the present application are merely illustrative examples and are not intended to require or imply that the connections, arrangements and configurations must be made in the manner shown in the block diagrams. These devices, apparatuses, equipment, and systems may be connected, arranged and configured in any manner, as will be appreciated by those skilled in the art. The words such as "including", "comprising", "having", and the like are open-ended words that mean "including, but not limited to", and are used interchangeably. The words "or" and "and" as used herein refer to the word "and/or" and may be used interchangeably therewith unless the context clearly indicates otherwise. The word "such as" as used herein refers to the phrase "such as, but not limited to" and may be used interchangeably therewith.

It should also be noted that in the apparatus, equipment and method of the present application, the components or steps may be decomposed and/or recombined. Such decompositions and/or recombinations should be considered as equivalents to the present application.

The previous description of the disclosed aspects is provided to enable any person skilled in the art to make or use the present application. Various modifications to these aspects will be readily apparent to those skilled in the art, and the general principles defined herein may be applied to other aspects without departing from the scope of the present application. Therefore, the present application is not intended to be limited to the aspects shown herein but is to be accorded the broadest scope consistent with the principles and novel features disclosed herein.

The above description has been presented for purposes of illustration and description. Furthermore, this description is not intended to limit the embodiments of the present application to the form disclosed herein. Although various example aspects and embodiments have been discussed above, those skilled in the art will recognize that certain variations, modifications, changes, additions, and sub-combinations thereof should be included within the protection scope of the present application.

The invention claimed is:

1. A rotary liquid distributor in a liquid-cooled tank, comprising:
   a liquid distribution cavity, the liquid distribution cavity having a central shaft, and the liquid distribution cavity rotating around the central shaft in a first direction;
   a liquid distribution arm of a plurality of liquid distribution arms uniformly distributed in a circumferential direction of the liquid distribution cavity relative to the central shaft, the liquid distribution arm rotating with the liquid distribution cavity, a first end of the liquid distribution arm communicating with the liquid distribution cavity, and a second end of the liquid distribution arm being closed,
   wherein a liquid distribution outlet is provided between the first end and the second end of the liquid distribution arm, and the liquid distribution outlet is located on a side of the liquid distribution arm facing away from the first direction;
   the liquid distribution outlet allows a cooling liquid flowing into the liquid distribution cavity to flow out of the rotary liquid distributor, and
   wherein the rotary liquid distributor is provided at the bottom end of the liquid-cooled tank, and the central shaft is provided in a second direction from the bottom end of the liquid-cooled tank to the top end.

2. The rotary liquid distributor according to claim 1, wherein the liquid distribution outlet at least comprises a first liquid distribution outlet at the first end of the liquid distribution arm.

3. The rotary liquid distributor according to claim 1, wherein the liquid distribution outlet at least comprises a first liquid distribution outlet at the first end of the liquid distribution arm and a second liquid distribution outlet at the second end of the liquid distribution arm, and when the second liquid distribution outlet rotates at a constant speed in the first direction, a linear rotation speed of the second liquid distribution outlet is not less than a flow speed of the cooling liquid.

4. The rotary liquid distributor according to claim 1, wherein a first diversion port is provided between the first end and the second end of the liquid distribution arm, the first diversion port is externally connected with a liquid distribution sub-pipe relative to the liquid distribution arm, the liquid distribution outlet is provided at an outer end of the liquid distribution sub-pipe, and an axis of the liquid distribution sub-pipe forms a predetermined angle with an axis of the liquid distribution arm.

5. The rotary liquid distributor according to claim 4, wherein the liquid distribution outlet is inclined towards the second end of the liquid distribution arm relative to the first diversion port.

6. The rotary liquid distributor according to claim 4, wherein the rotary liquid distributor is provided at a bottom end of a liquid-cooled tank, the central shaft is provided in a direction from the bottom end of the liquid-cooled tank to a top end, and the liquid distribution outlet is inclined towards the top end of the liquid-cooled tank relative to the first diversion port.

7. The rotary liquid distributor according to claim 1, wherein
   the cross section of the liquid distribution cavity is circular in the direction of the central shaft; and/or,
   the cross section of the liquid distribution arm is oval in the direction of the axis of the liquid distribution arm, and a minor axis of the oval is parallel to the central shaft.

8. The rotary liquid distributor according to claim 1, wherein a plurality of second diversion ports are uniformly distributed in the circumferential direction of the liquid distribution cavity relative to the central shaft, and the first end of the liquid distribution arm is connected to the second diversion port.

9. The rotary liquid distributor according to claim 8, wherein the plurality of second diversion ports are distributed centrally symmetrically relative to the central shaft in the circumferential direction of the liquid distribution cavity;

the first end of the liquid distribution arm is detachably connected to the second diversion port, and the rotary liquid distributor further comprises a diversion cover for closing the second diversion port to which the liquid distribution arm is not connected.

10. The rotary liquid distributor according to claim 1, wherein a plurality of the rotary liquid distributors are uniformly arranged in a plane perpendicular to the second direction.

11. The rotary liquid distributor according to claim 10, wherein an end of the liquid distribution cavity facing away from the second direction is provided with a liquid distribution inlet, the liquid distribution inlet is externally connected with a liquid inlet sub-pipe, the liquid inlet sub-pipe communicates with a liquid inlet main pipe, and the liquid inlet main pipe also communicates with a liquid inlet at the bottom end of the liquid-cooled tank; and an axis of the liquid inlet sub-pipe coincides with the central shaft whereby the liquid distribution cavity rotates around the liquid inlet sub-pipe in the first direction.

12. A liquid-cooled tank, wherein a bottom end of the liquid-cooled tank is provided with a liquid inlet allowing the circular inflow of a cooling liquid, and a top end of the liquid-cooled tank is provided with a liquid outlet allowing the circular outflow of the cooling liquid; and the liquid inlet communicates with a liquid distributor at the bottom end of the liquid-cooled tank, wherein the liquid distributor is the rotary liquid distributor according to claim 1.

13. The liquid-cooled tank according to claim 12, wherein the liquid-cooled tank comprises a side wall, an overflow liquid return trough is provided on an outer side of a top end of the side wall whereby the cooling liquid overflows from the top end of the side wall and flows into the overflow liquid return trough, and the liquid outlet is provided at a lower end of the overflow liquid return trough.

14. The liquid-cooled tank according to claim 13, wherein the overflow liquid return trough circumferentially surrounds at least three side walls; or, the liquid-cooled tank is a rectangular parallelepiped, the liquid-cooled tank comprises a first side wall and a second side wall in pair, the length of the first side wall is greater than the length of the second side wall, and the overflow liquid return trough is provided outside the first side wall.

\* \* \* \* \*